United States Patent [19]

Watanabe et al.

[11] Patent Number: 5,409,857
[45] Date of Patent: Apr. 25, 1995

[54] PROCESS FOR PRODUCTION OF AN INTEGRATED CIRCUIT

[75] Inventors: Seiichi Watanabe, Tokyo; Setsuo Usui, Kanagawa, both of Japan

[73] Assignee: Sony Corporation, Japan

[21] Appl. No.: 403,934

[22] Filed: Sep. 7, 1989

[30] Foreign Application Priority Data

Sep. 7, 1988 [JP] Japan .............................. 63-223962

[51] Int. Cl.$^6$ .............................................. H01L 21/20
[52] U.S. Cl. .................................... 437/101; 437/907; 437/908; 437/915; 148/DIG. 90; 148/DIG. 164
[58] Field of Search ................ 437/101, 907, 908, 967, 437/966, 915; 148/DIG. 90, DIG. 1, DIG. 3, DIG. 164

[56] References Cited

U.S. PATENT DOCUMENTS

4,370,175  1/1983  Levatter .................................. 437/2
4,389,481  6/1983  Poleshuk et al. ................... 437/915
4,565,584  1/1986  Tamura et al. ...................... 156/603

OTHER PUBLICATIONS

T. Sameshima, S Usui & M. Sekiya "XeCl Excimer Laser Annealing Used in the Fabrication of Poly-Si TFT's" IEEE Elect. Dev. Lett EdL-7 #5 p. 276 (1986).

*Primary Examiner*—R. Bruce Breneman
*Assistant Examiner*—Linda J. Fleck
*Attorney, Agent, or Firm*—Ronald P. Kananen

[57] ABSTRACT

An integrated circuit is formed thereof a conductive wiring pattern. On the conductive wiring semiconductor layer is directly formed in a form of amorphous on the substrate. The amorphous semiconductor layer is annealed to form a polycrystalline structure while avoiding influence of annealing heat for the substrate. In the polycrystalline semiconductor layer is formed a semiconductor element, such as MOS transistor, MIS transistor, TFT and so forth. The semiconductor element is directly connected to the wiring pattern on the substrate.

19 Claims, 6 Drawing Sheets

PROCESS FOR PRODUCTION OF AN INTEGRATED CIRCUIT

BACKGROUND OF THE INVENTION

1. Field of the Invention

The present invention relates to an integrated circuit and production thereof. More specifically, the invention relates to an integrated circuit which is formed of a printed wiring pattern and a MIS transistor on an organic substrate, and a production process therefor.

2. Description of the Background Art

In the modern semiconductor technologies, there are some semiconductor devices formed on a organic substrates which are formed of or contain organic material. In fabricating of such semiconductor devices, the organic substrate with electrically conductive wiring and the semiconductor device are formed separately and coupled together in a later process. For example, when a semiconductor active element is formed on the organic substrate with thin copper printed wiring, a prefabricated package forming a discrete part is connected to the printed wiring. In the alternative, a semiconductor chip is installed on the organic substrate.

Because such prior technologies in fabricating the semiconductor device on the organic substrate employ a process of separately forming the substrate and the semiconductor element relative to each other and subsequently connecting or installing the semiconductor element to the substrate, the following shortcoming have been encountered.

Since it requires exposure of a lead or so forth for a later connection, area efficiency becomes unsatisfactory.

When a large number of semiconductor elements are to be installed, the installation process becomes substantial and thus increases a number of fabrication steps. Furthermore, increasing fabrication steps can lower reliability of the semiconductor device.

SUMMARY OF THE INVENTION

Therefore, it is an object of the present invention to provide a novel technology for fabricating a semiconductor integrated circuit, which can solve the problem in the prior art.

In order to accomplish the aforementioned and other objects, an integrated circuit, according to the present invention, is formed thereof with a conductive wiring pattern. On the conductive wiring a semiconductor layer is directly formed in a form of an amorphous semiconductor layer on the substrate. The amorphous semiconductor layer is annealed to form a polycrystalline structure while avoiding influence of annealing heat for the substrate. In the polycrystalline semiconductor layer is formed a semiconductor element, such as an MOS transistor, an MIS transistor, a TFT and so forth. The semiconductor element is directly connected to the wiring pattern on the substrate.

According to one aspect of the invention, a semiconductor device comprises:
an organic substrate having electrically conductive wiring formed on the surface thereof;
a semiconductor element having at least one active region; and
an electrode formed on the substrate and in direct contact with the conductive wiring and the active region.

The semiconductor element may be a transistor having a source region and drain region of polycrystalling silicon directly formed on the substrate, and the electrode is also directly formed on the substrate at a desired orientation while maintaining electric contact with the wiring and a respective one of the source and drain regions.

According to another aspect of the invention, a semiconductor device comprising:
an organic substrate having an electrically conductive wiring formed on the surface thereof;
a semiconductor element having at least one active region, the active region being in direct contact with the wiring.

The semiconductor element may be a transistor having a source region and drain region of polycrystalline silicon directly formed on the substrate and in direct contact with the conductive wiring.

According to a further aspect of the invention, a process for fabricating a semiconductor device having an organic substrate formed with a conductive wiring, comprises the steps of:
directly forming an amorphous semiconductor layer on the substrate;
performing polycrystallization of the amorphous semiconductor by laser beam annealing; and
forming a semiconductor element in the polycrystalline semiconductor, which semiconductor element having at least one active region; and
forming an electrode in direct contact with the conductive wiring and the active region.

The laser beam annealing process is performed by means of a laser having low permeability of laser beam. For this, an excimer laser is preferred to use in the annealing process. The excimer laser may be selected among $XeC\chi$ excimer laser, KrF excimer laser, $KrC\chi$ excimer laser, ArF excimer laser, and Fz excimer laser. Preferably, the laser to be used for the annealing process has wavelength less than or equal to 500 nm, more preferably, less than or equal to 300 nm.

According to a still further aspect, a process for fabricating a semiconductor device having an organic substrate formed thereon a conductive wiring, comprises the steps of;
directly forming an amorphous semiconductor layer on the substrate;
performing polycrystallization of the amorphous semiconductor by laser beam annealing; and
forming a transistor having a source region, a drain region in the polycrystalline semiconductor; and
forming an electrode in direct contact with the conductive wiring and the source and drain regions.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1A:
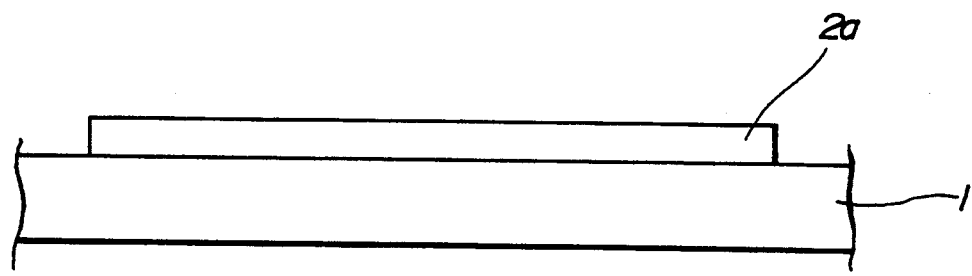
FIGS. 1(*a*) through 1(*f*) show a process for fabricating a semiconductor element on an organic substrate for implementing the first preferred fabrication process according to the invention.

Referring now to the drawings, particularly to FIGS. 1(a) through 1(f), the first preferred process in fabricating a semiconductor integrated circuit according to the present invention is illustrated. The shown process examplifies fabrication of a thin film transistor (TFT). As seen from FIG. 1(f), the TFT includes an organic substrate 1, on which a conductive wiring pattern is formed. In the specific embodiment, the substrate is formed of Bakelite brand organic plastic material or other organic material. The conductive wiring formed on the substrate 1 is formed of a thin copper strip printed into a desired wiring pattern. The TFT is formed in a polycrystalline silicon layer, as a semiconductor layer, by forming source and drain regions 31 and 32, and a gate insulating layer 4 and a gate electrode 5 on the semiconductor layer. The source and drain regions 31 and 32 are connected to the printed wiring via connecting electrodes 61 and 62.

As will be appreciated, since the TFT is directly formed on the organic substrate 1, the electrodes 61 and 62 can be directly connected to the printed wiring on the substrate to form desired circuitry. Therefore, the shown embodiment do not require additional production steps for connecting the semiconductor element with the printed wiring and/or for installing the semiconductor element on the substrate. Since the shown embodiment allows fabrication with a reduced number of reliability steps, can be held much higher than that in the prior art.

The process of fabrication of the shown embodiment of the TFT with the organic substrate 1 will be discussed hereinbelow with reference to FIGS. 1(a) to 1(f). At first, an amorphous silicon layer 2a is formed on the organic substrate 1, on which the circuit wiring is printed to form the construction shown in FIG. 1(a). Subsequently, a laser beam 7 is irradiated on the amorphous silicon layer 2a for heating. By heating, the amorphous form a silicon is polycrystallized to form polycrystalline silicon layer 2.

The laser used for heating the amorphous silicon layer has short laser beam wavelength and thus has a low permeability so as not to reach the organic substrate. It is important that the substrate is held unheated because the organic substrate may cause decomposition or a change of property to degrade performance of the fabricated semiconductor device. For this reason, an excimer laser is preferred for use in the process for converting the amorphous form silicon into a polycrystalline silicon. Further preferably, an excimer laser having a wavelength of less than or equal to 400 nm, further preferably a wavelength of less than or equal to 300 nm, is used. In this sense, an $XeC\chi$ excimer laser having a wavelength of 308 nm, a KrF excimer laser having a wavelength of 249 nm, a $KrC\chi$ excimer laser having a wavelength of 222 nm, a ArF excimer laser having a wavelength of 193 nm, and an Fz excimer laser having a wavelength of 157 nm and so forth are preferred to use.

Figure 1B:
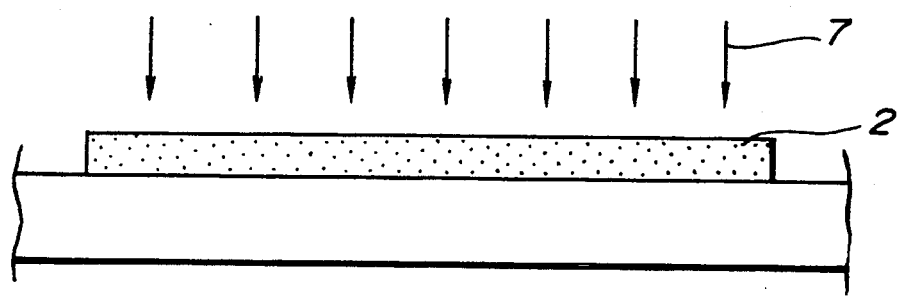
Figure 1C:
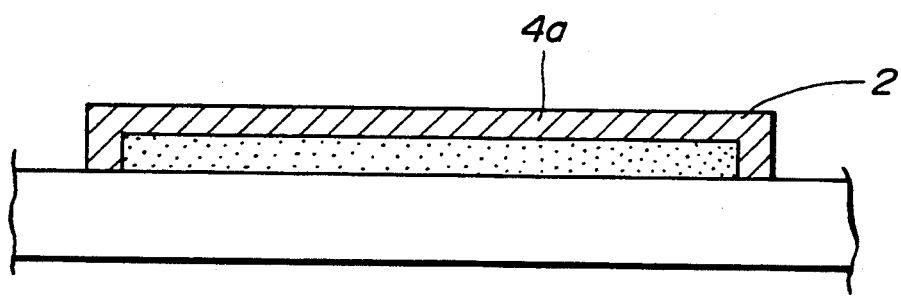
Figure 1D:
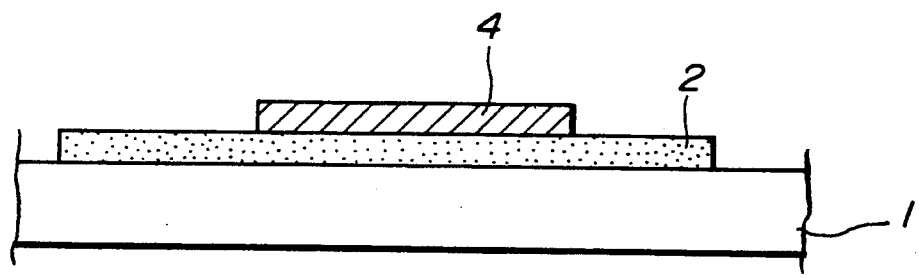
Figure 1E:
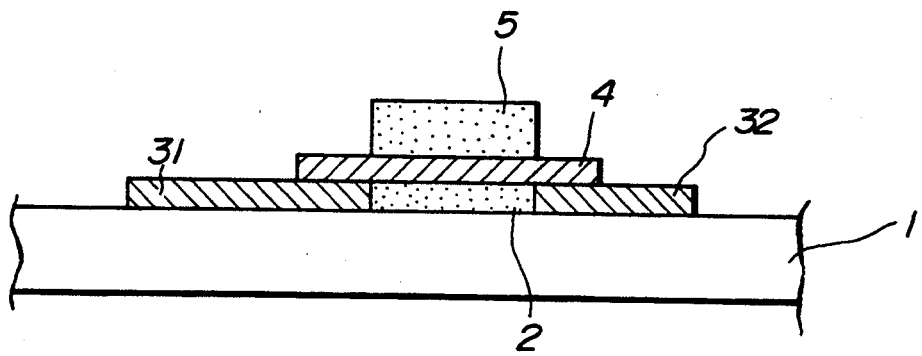
Figure 1F:
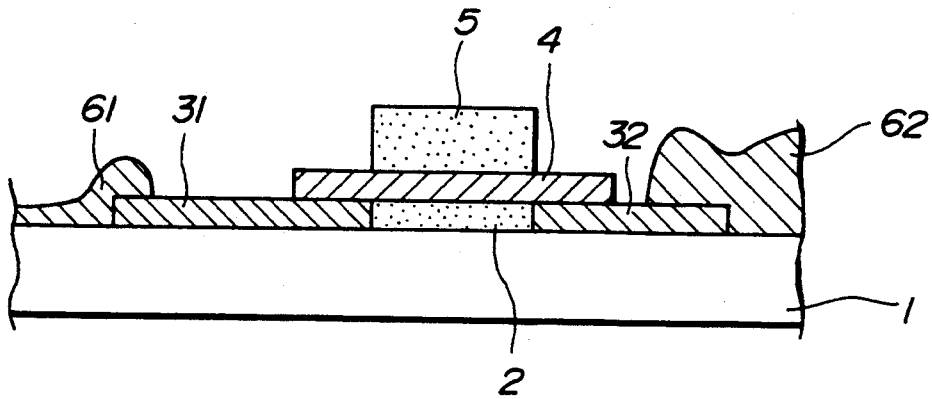

After forming a polycrystalline silicon layer in the process of FIG. 1(b), an insulating layer 4a for forming a gate insulating layer, is formed surrounding the polycrystalline silicon layer 2. The insulating layer is formed of a layer 4a of silicon dioxide, as shown in FIG. 1(c). Subsequently, patterning is performed for forming a gate insulating layer 4, as shown in FIG. 1(d). On the gate insulating layer 4 thus formed, a gate electrode 5 of polycrystalline silicon is formed. At the same time, a source region 31 and a drain region 32 are formed by ion implantation, as shown in FIG. 1(e). Thereafter, through formation of metallic layers and subsequent patterning, the connecting electrodes 61 and 62 are formed as shown in FIG. 1(f).

It should be appreciated that any process for forming layers may be taken for implementing the shown process. For example, the layers may be formed through chemical vapor deposition (CVD) at low temperature, e.g. approximately 100° C., or by spattering, evaporation, printing and so forth. Also, it may be possible to form a gate electrode and source/drain regions simultaneously at single step without performing ion implantation. Furthermore, it is also possible to form a mask in place of the gate electrode in advance of ion implantation and subsequently perform ion implantation for forming the source and drain regions utilizing the mask. After formation of the source and drain regions, the mask is removed for forming the gate electrode. In addition, in the last case, it may be possible to form the gate electrode and connecting electrode simultaneously with a single process step.

Figure 2A:
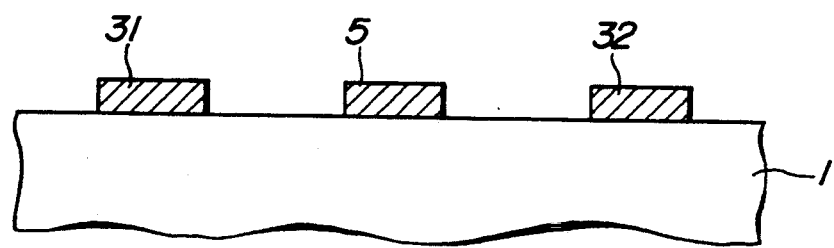
FIGS. 2(*a*) through 2(*f*) show another process for fabricating a semiconductor integrated circuit for implementing the second preferred fabrication process according to the invention.
Figure 2B:
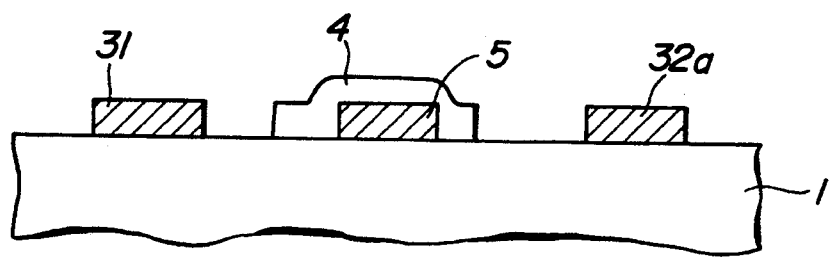
Figure 2C:
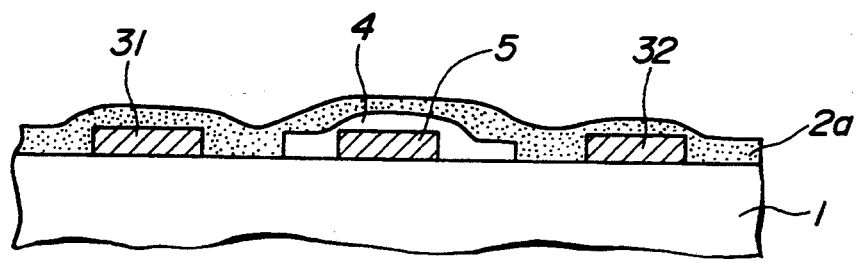
Figure 2D:
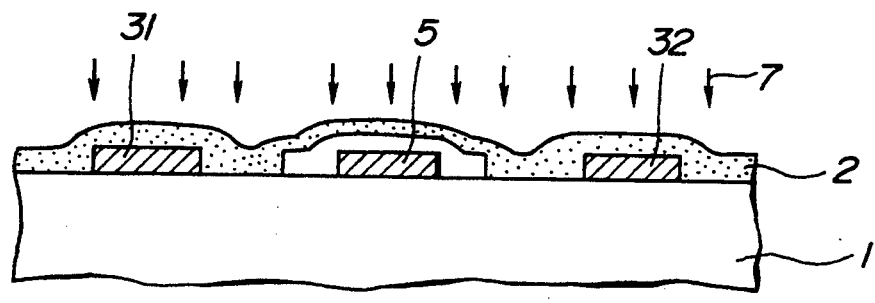
Figure 2E:
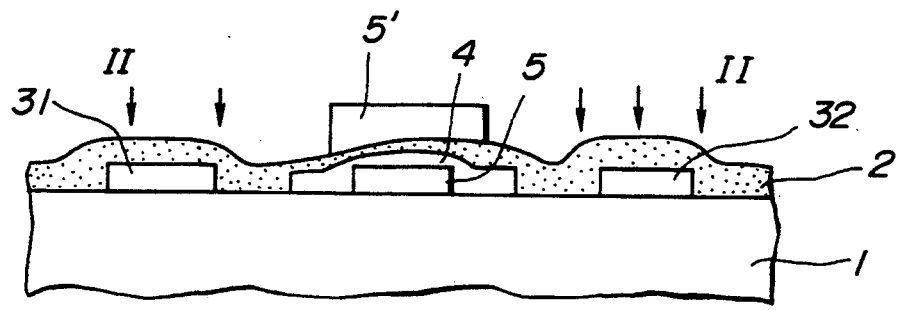
Figure 2F:
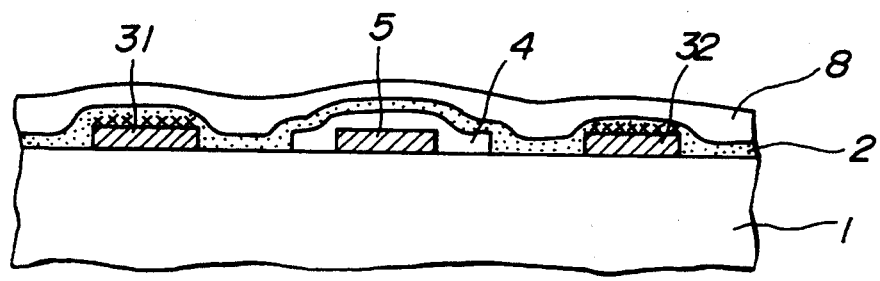

FIGS. 2(a) through 2(f) show a process of another type of semiconductor device the final structure of which is shown in FIG. 2(f). As can be seen from FIG. 2(f), the shown embodiment of a MIS transistor has a layout having a gate electrode 5, a source region 31 and a drain region 32 on the same plane. The gate electrode 5 is covered by a gate insulating layer 4 which is formed of an oxide layer. Covering all of the source region 31, the gate insulating layer 4 and the drain region 32, a polycrystalline silicon layer 2 and a protective layer 8 are formed.

In this embodiment, the source and drain regions 31 and 32 may be formed directly on the printed wiring on the organic substrate.

In the fabrication process, the gate electrode 5, the source region 31 and the drain region 32 are initially formed on the organic substrate 1 with the printed circuit wiring thereon, as shown in FIG. 2(a). Then, a silicon dioxide insulating layer 4 is formed surrounding the gate electrode by CVD. Then, etching is performed for patterning to form the gate insulating layer as shown in FIG. 2(b).

Subsequently, an amorphous silicon layer 2a covering all of the source region 31, the gate insulating layer 4, and the drain region 32 is formed, as shown in FIG. 2(c). Subsequently, annealing by means of a laser beam is performed for polycrystallization of the amorphous form silicon. Therefore, the polycrystalline silicon layer 2 is formed, as shown in FIG. 2(d).

It should be noted that if channels are to be formed, formation of channels by doping impurity is performed in advance of the polycrystallization process of FIG. 2(d).

Then, a high concentration ion implantation is performed for the source region 31 and the drain region 32 for making this, regions active, as shown in FIG. 2(e). By this ohmic contact as shown by (xx) in FIG. 2(e) is established between the polycrystalline silicon layer and the source/drain regions 31, 32. During this ion implantation, a mask 5' may be applied for the position corresponding to the gate electrode 5. This step is not always necessary for implementing the fabricating process of the present invention.

The order of annealing and ion implantation can be reversed, if necessary. Therefore, the order to these steps are not essential to the present invention.

Finally, as shown in FIG. 2(f), the protective layer 8 is formed for completing the semiconductor integrated circuit.

It is also possible to form an insulating layer, such as a silicon dioxide layer, between the substrate and the source and drain regions and the gate electrode.

Figure 3A:
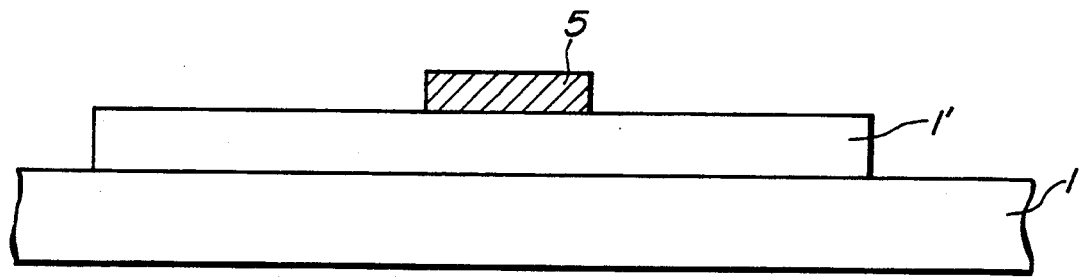
FIGS. 3(a) through 3(c) show a further process for fabricating a semiconductor integrated circuit for implementing the third preferred process according to the invention.
Figure 3B:
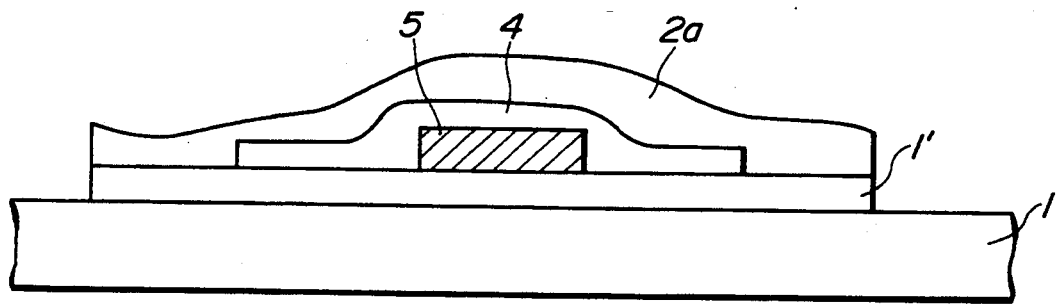
Figure 3C:
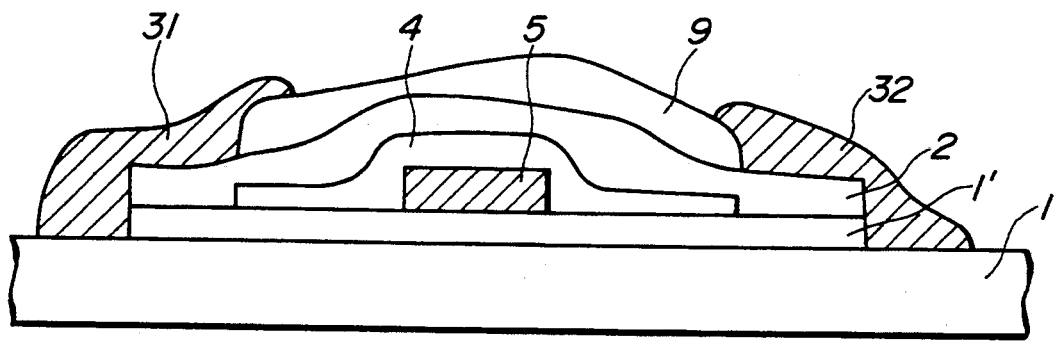

FIGS. 3(a) through 3(c) illustrate modification of the foregoing embodiment. In the shown embodiment, a silicon dioxide layer 1' is formed on the organic substrate 1 as a silicon dioxide layer. On the base layer 1', the gate electrode 5 is formed, as shown in FIG. 3(a). Subsequently, a silicon dioxide layer 4 as the gate insulating layer is formed and the amorphous silicon layer 2a covering the gate insulating layer 4 is formed, as shown in FIG. 3(b). Thereafter, annealing is performed for converting the amorphous silicon layer into polycrystalline silicon layer. Above this polycrystalline silicon layer a silicon dioxide layer 9, and source and drain regions 31 and 32 are formed as shown in FIG. 3(c).

Figure 4:
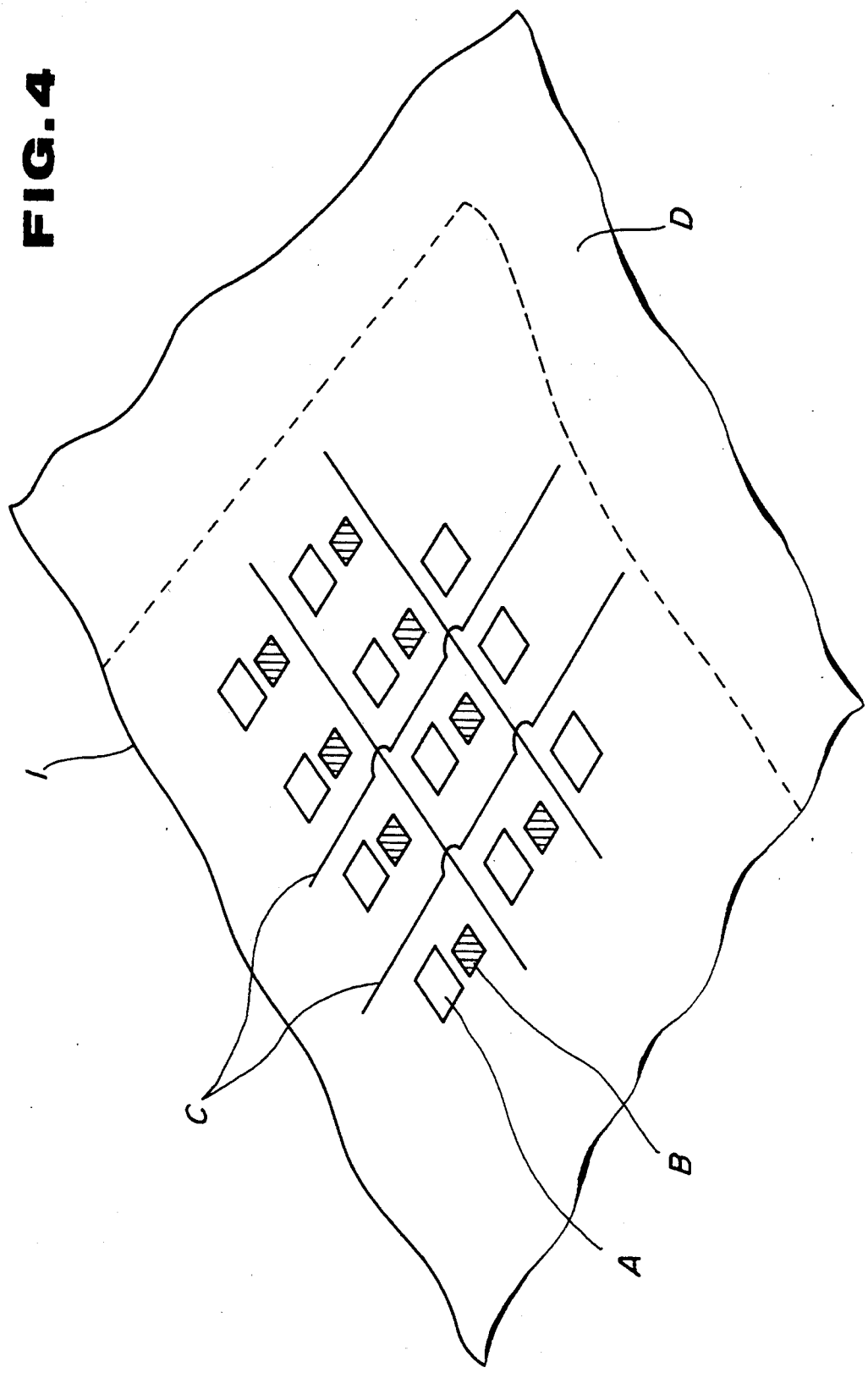
FIG. 4 is an illustration showing a practical application of the semiconductor element fabricating process according to the present invention.

FIG. 4 shows a semiconductor image pick-up device constituted by an array of a plurality of photosensitive elements fabricated utilizing the technology according to the present invention. In the shown example, each element comprises an image pick-up element A and a switching transistor B. The image pick-up element is fabricated as a metal oxide semiconductor (MOS) element having a photo-conductive element and a charge capacitor. On the other hand, the switching transistor comprises a TFT. A plurality of image pick-up devices and switching transistors are arranged as shown in FIG. 4 for forming a photo-sensitive array. In such case, since the present invention avoids a necessity for additional wiring for connecting the semiconductor element with the wiring C, each element of the semiconductor device becomes more compact than that in the prior art and thus allows the overall device to be more compact or higher density in arranging the semiconductor elements.

While the present invention has been disclosed in terms of the preferred embodiment in order to facilitate a better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A process for fabricating a semiconductor device on an organic substrate with conductive wiring formed thereon, comprising the steps of;

directly forming an amorphous semiconductor layer on said substrate while said conductive wiring remains formed thereon;

polycrystallizing said amorphous semiconductor to a polycrystalline semiconductor by a step of laser beam annealing; and forming a semiconductor element in the polycrystalline semiconductor, wherein the semiconductor element has at least one active region; and forming an electrode in direct contact with said conductive wiring formed on said organic substrate and said active region of said semiconductor element.

2. A process as set forth in claim 1, wherein said step of laser beam annealing is performed by means of a laser having a low permability laser beam.

3. A process as set forth in claim 2, wherein said step of laser beam annealing is performed by means of an excimer laser.

4. A process as set forth in claim 3, wherein said step of laser beam annealing is performed by means of an excimer laser selected from among an XeC$\chi$ excimer laser, a KrF excimer laser, a KrC$\chi$ excimer laser, a ArF excimer laser, and an Fz excimer laser.

5. A process as set forth in claim 2, wherein said step of laser beam annealing is performed by means of a laser having wavelength less than or equal to 500 nm.

6. A process as set forth in claim 5, wherein said step of laser beam annealing is performed by means of a laser having wavelength less than or equal to 300 nm.

7. A process for fabricating a semiconductor device on an organic substrate having conductive wiring formed on said organic substrate comprising the steps of;

directly forming an amorphous semiconductor layer on said substrate while said conductive wiring remains formed on the substrate;

polycrystallizing said amorphous semiconductor to a polycrystalline semiconductor by a step of laser beam annealing;

forming a transistor having a source region and a drain region in the polycrystalline semiconductor; and forming an electrode in direct contact with said conductive wiring and said source and drain regions of said transistor.

8. A process as set forth in claim 7, wherein said step of laser beam annealing is performed by means of a laser having a low permeability laser beam.

9. A process as set forth in claim 8, wherein said step of laser beam annealing is performed by means of an excimer laser.

10. A process as set forth in claim 9, wherein said step of laser beam annealing is performed by means of an excimer laser selected from among an XeC$\chi$ excimer laser, a KrF excimer laser, a KrC$\chi$ excimer laser, an ArF excimer laser, and a Fz excimer laser.

11. A process as set forth in claim 8, wherein said step of laser beam annealing is performed by means of a laser having wavelength less than or equal to 500 nm.

12. A process as set forth in claim 11, wherein said step of laser beam annealing is performed by means of a laser having wavelength less than or equal to 300 nm.

13. A process for fabricating a semiconductor device on an organic substrate which has a printed conductive wiring on said organic substrate, comprising the steps of:

directly forming an amorphous semiconductor layer on said substrate while said printed conductive wiring remains on said organic substrate;

performing polycrystallization of said amorphous semiconductor by laser beam annealing;

forming a semiconductor element in the polycrystalline semiconductor, said semiconductor element having at least one active region; and forming an electrode in direct contact with said conductive wiring and said active region of said semiconductor element.

14. A method of fabricating a semiconductor integrated circuit from an organic substrate on which a conductive wiring pattern is formed, comprising the steps of:

forming an amorphous silicon layer directly on said organic substrate on which said conductive wiring pattern is formed;

irradiating said amorphous silicon layer with a laser beam to polycrystallize said layer to form a polycrystalline silicon layer without heating said organic substrate;

forming a gate electrode on said polycrystalline silicon layer;

forming source and drain regions; and connecting said source and drain regions to said conductive wiring pattern by connecting electrodes.

15. The process as set forth in claim 14 wherein the step of irradiating is performed by an excimer laser.

16. The process as set forth in claim 14 wherein the steps of forming a gate electrode and said source and drain region occur simultaneously.

17. The process as set forth in claim 14 wherein the step of forming a gate electrode is preceded by a step of forming a gate insulating layer on said polycrystalline silicon layer and said gate electrode is a polycrystalline silicon material.

18. The process as set forth in claim 17 wherein the gate insulating layer is formed of an oxide layer and said source and drain regions are formed directly on said printed wiring.

19. The process as set forth in claim 14 wherein a silicon dioxide layer is formed on said organic substrate and said gate electrode is formed on said silicon dioxide layer.

* * * * *